US011522572B1

(12) United States Patent
Yadav et al.

(10) Patent No.: US 11,522,572 B1
(45) Date of Patent: Dec. 6, 2022

(54) AUDIO NON-LINEARITY CANCELLATION FOR SWITCHES FOR AUDIO AND OTHER APPLICATIONS

(71) Applicant: QUALCOMM Incorporated, San Diego, CA (US)

(72) Inventors: Kshitij Yadav, San Diego, CA (US); Vijayakumar Dhanasekaran, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/323,685

(22) Filed: May 18, 2021

(51) Int. Cl.
*H04B 1/40* (2015.01)
*H03F 3/19* (2006.01)
*H03F 3/18* (2006.01)
*H03F 3/193* (2006.01)
*H03F 3/185* (2006.01)

(52) U.S. Cl.
CPC .............. *H04B 1/40* (2013.01); *H03F 3/185* (2013.01); *H03F 3/193* (2013.01); *H03F 2200/03* (2013.01); *H03F 2200/451* (2013.01)

(58) Field of Classification Search
CPC . H04B 1/40; H03F 3/185; H03F 3/193; H03F 2200/03; H03F 2200/451
See application file for complete search history.

(56) References Cited

U.S. PATENT DOCUMENTS

| 4,093,874 | A | 6/1978 | Pollitt | |
|---|---|---|---|---|
| 10,019,021 | B1 * | 7/2018 | Lee | H02M 3/158 |
| 10,554,185 | B2 * | 2/2020 | Høyerby | H03F 1/523 |
| 2006/0001488 | A1 * | 1/2006 | Ryoo | H03F 3/2171 330/251 |
| 2010/0156521 | A1 | 6/2010 | Stultz et al. | |
| 2011/0133810 | A1 | 6/2011 | Guo et al. | |
| 2012/0230519 | A1 | 9/2012 | Nussbaum et al. | |
| 2014/0079249 | A1 * | 3/2014 | Chen | H03F 3/185 381/120 |
| 2015/0222237 | A1 * | 8/2015 | Cotton | H03F 3/45479 381/120 |
| 2018/0083618 | A1 | 3/2018 | Sato et al. | |
| 2018/0226926 | A1 * | 8/2018 | Miyake | H03F 3/2171 |
| 2018/0331660 | A1 * | 11/2018 | Høyerby | H03F 3/2171 |
| 2019/0363681 | A1 * | 11/2019 | Saegusa | H04R 3/007 |

(Continued)

OTHER PUBLICATIONS

International Search Report and Written Opinion—PCT/US2022/026790—ISA/EPO—Aug. 9, 2022.

*Primary Examiner* — Aristocratis Fotakis
(74) *Attorney, Agent, or Firm* — Loza & Loza, LLP

(57) ABSTRACT

An aspect includes an apparatus including a first amplifier; a first field effect transistor (FET) including a first source coupled to an output of the first amplifier, and a first drain for coupling to a first load; and a first gate drive circuit including an input coupled to the output of the first amplifier and an output coupled to a first gate of the first FET. Another aspect includes a method including amplifying a first audio signal using a first audio amplifier to generate a first voltage; generating a first gate voltage based on the first voltage; applying the first gate voltage to a first gate of a first field effect transistor (FET) coupled between the first audio amplifier and a first audio transducer; and applying the first voltage to a first source of the first FET.

29 Claims, 5 Drawing Sheets

(56) References Cited

U.S. PATENT DOCUMENTS

2020/0169234 A1\* 5/2020 Li ............................ H03F 3/68
2022/0014154 A1\* 1/2022 Wu ......................... H03F 1/305
2022/0029541 A1\* 1/2022 Rosenbaum .......... H02M 3/156

\* cited by examiner

US 11,522,572 B1

AUDIO NON-LINEARITY CANCELLATION FOR SWITCHES FOR AUDIO AND OTHER APPLICATIONS

FIELD

Aspects of the present disclosure relate generally to signal non-linearity cancellation, and in particular, to audio non-linearity cancellation for switches for audio and other applications.

BACKGROUND

An integrated circuit (IC) may provide different types of data to one or more devices connected to a signal port, such as a Universal Serial Bus (USB) port. The devices connected to a USB port, for example, may vary significantly. Some devices receive high speed USB data (e.g., up to 10 Gigabytes per second), and other devices, such as audio devices, receive audio data at much lower speeds (e.g., 40 Kilobytes per second). Because of the large speed disparity, and common USB port through which the data propagates, there are many challenges to accommodate different types of data.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a first amplifier; a first field effect transistor (FET) including a first source coupled to an output of the first amplifier, and a first drain for coupling to a first load; and a first gate drive circuit including an input coupled to the output of the first amplifier and an output coupled to a first gate of the first FET.

Another aspect of the disclosure relates to a method. The method includes amplifying a first audio signal using a first audio amplifier to generate a first voltage; generating a first gate voltage based on the first voltage; and applying the first gate voltage to a first gate of a first field effect transistor (FET) coupled between the first audio amplifier and a first audio transducer.

Another aspect of the disclosure relates to an apparatus. The apparatus includes means for amplifying a first audio signal using a first audio amplifier to generate a first voltage; means for generating a first gate voltage based on the first voltage; and means for applying the first gate voltage to a first gate of a first field effect transistor (FET) coupled between the first audio amplifier and a first audio transducer.

Another aspect of the disclosure relates to a wireless communication device. The wireless communication device includes at least one antenna; a transceiver coupled to the at least one antenna; at least one digital signal processing core coupled to the transceiver; a port configured to connect to one of at least one audio transducer and a digital data device; at least one audio amplifier; at least one field effect transistor (FET) including a source coupled to an output of the at least one audio amplifier, respectively, and a drain coupled to the port; and at least one gate drive circuit including an input coupled to the output of the at least one audio amplifier, and an output coupled to a gate of the at least one FET.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
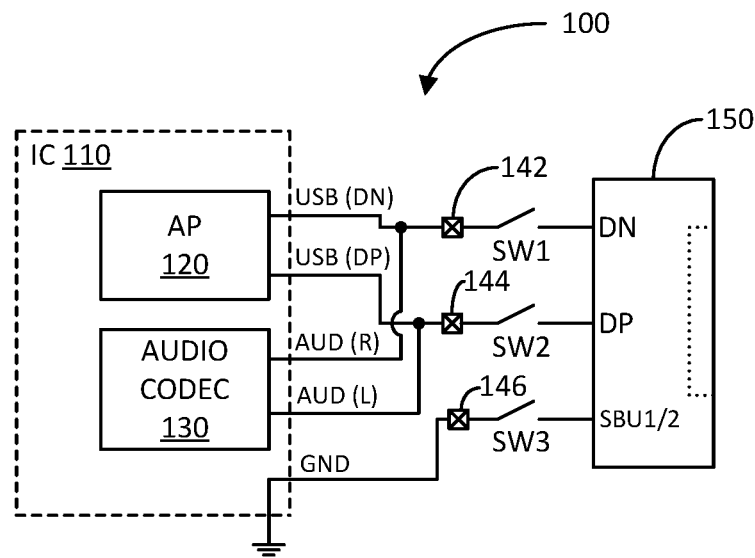
FIG. 1 illustrates a block/schematic diagram of an example apparatus for transmitting different types of data via one or more common nodes in accordance with an aspect of the disclosure.

FIG. 1 illustrates a block/schematic diagram of an example apparatus 100 for transmitting different types of data via one or more common nodes in accordance with an aspect of the disclosure. In this example, the different types of data include Universal Serial Bus (USB) digital data signal and analog audio signal. However, it shall be understood that the concepts described herein may be used with respect to other types of signals.

The apparatus 100 includes an integrated circuit (IC) 110, which may be configured as a system on chip (SOC) or other type of IC. The IC 110 includes an application processor (AP) 120 configured to generate a USB differential data signal including a negative differential component USB (DN) and positive differential component USB (DP), where "D" stands for data, and "N" and "P" stand for negative and positive, respectively. The IC 110 further includes an audio codec 130 configured to generate an analog audio signal AUD (R) and AUD (L), where "R" represents the right-channel signal component and "L" represents the left-channel signal component.

The apparatus 100 further includes a USB port 150, such as a USB-C port or may be another version or type of port. A USB device (e.g., a USB flash drive) may be connected to the USB port 150 to receive the USB differential data signal USB (DN) and USB (DP) for storage and/or other purposes depending on the type of USB device. An audio device, such as an audio transducer like a headphone or speaker, may also be connected to the USB port 150 to receive the analog audio signal AUD (R) and AUD (L). Although not shown, the apparatus 100 may include a device detector configured to determine whether the device connected to the USB port 150 is of the type to receive the USB differential data signal USB (DN) and USB (DP) or an audio device to receive the analog audio signal AUD (R) and AUD (L).

The outputs of the AP 120 and audio codec 130 may connect to common nodes or pads 142, 144, and 146 (e.g., off-chip pads on a printed circuit board (PCB)). For example, the outputs USB (DN) and the AUD (R) associated with the AP 120 and audio codec 130 may connect to common node or pad 142, respectively. The outputs USB (DP) and the AUD (L) associated with the AP 120 and audio codec 130 may connect to common node or pad 144, respectively. The IC 110 may include a ground or return coupled to a node or pad 146. The apparatus 100 may further include switching devices SW1, SW2, and SW3 connected between the nodes or pads 142, 144, and 146, and DN, DP, and sideband use (SBU) 1/2 terminals of the USB port 150, respectively.

One of the challenges of the apparatus 100 is that different types of data share the common nodes or pads 142, 144, and 146 including the switching devices SW1-SW3, respectively. For example, the USB differential data signal USB (DN) and USB (DP) may have a data rate or frequency bandwidth (e.g., up to 10 gigabits per second (Gbps)) much higher than the analog audio signal AUD (R) and AUD (L) (e.g., 48 kilobits per second (Kbps)). The analog audio signal AUD (R) and AUD (L) may include a total harmonic distortion (THD) of up to 110 or 120 dB.

The difference in the USB differential data signal and the analog audio signal provides competing characteristics of the switching devices SW1 to SW3 through which these signals propagate. For example, the relatively high data rate of the USB differential data signal suggests that the switching devices SW1-SW3 be made relatively small to keep the capacitances of these devices small, so they do not impact the USB differential data signal. However, the analog audio signal requires relatively high THDs, which suggests that the switching devices SW1-SW3 be made relatively large to handle the relatively high power of the analog audio signal. For example, the terminals of the switching devices SW1-SW3 may be required to handle up to 20 Volts.

Figure 2:
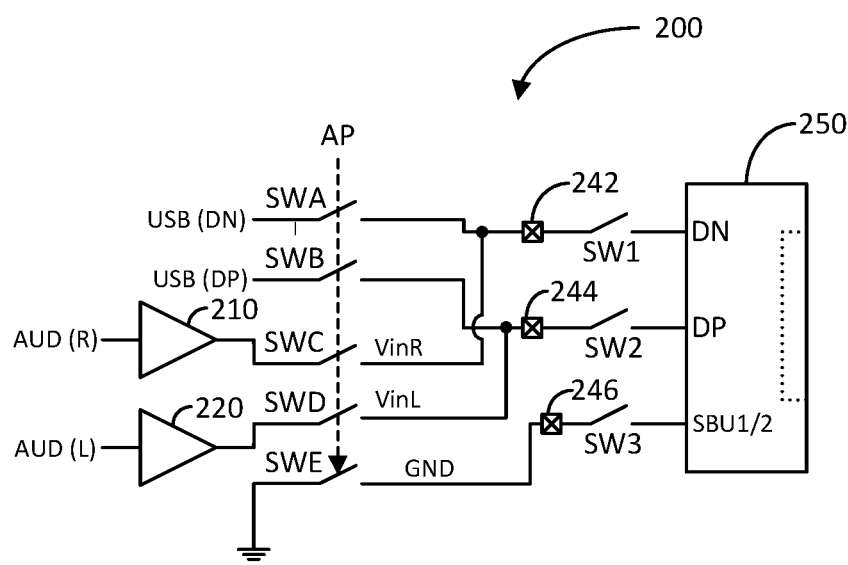
FIG. 2 illustrates a block/schematic diagram of another example apparatus for transmitting different types of data via one or more common nodes in accordance with another aspect of the disclosure.

FIG. 2 illustrates a block/schematic diagram of another example apparatus 200 for transmitting different types of data via one or more common nodes in accordance with another aspect of the disclosure. The apparatus 200 may be an example more detailed implementation of the apparatus 100 previously discussed.

For example, the IC 110 may include audio amplifiers 210 and 220, and a set of switching devices SWA-SWE. The audio amplifier 210 is configured to receive the right-channel audio signal AUD (R), and the audio amplifier 220 is configured to receive the left-channel audio signal (L). The switching devices SWA-SWB are coupled between the USB (DN) and USB (DP) outputs of an application processor (AP), and nodes or pads 242 and 244, respectively. The switching devices SWC and SWD are coupled between outputs of the audio amplifiers 210 and 220 and nodes or pads 242 and 244, respectively. The switching device SWE is coupled between ground and node or pad 246. The application processor (AP) may control the states (open/closed) of the set of switching devices SWA-SWE. The remaining circuitry of the apparatus 200 may be substantially the same as that of apparatus 100. That is, the apparatus 200 also includes the set of switching devices SW1-SW3 coupled between the nodes or pads 242, 244, and 246, and DN, DP, and SBU1/2 terminals of the USB port 250, respectively.

If the apparatus 200 detects a device connected to the USB port 250 that is to receive the USB differential data signal, the application processor (AP) closes switching devices SWA, SWB, SWE, and SW1-SW3, and opens SWC and SWD. In this configuration, the USB differential data signal USB (DN) and USB (DP) is sent to the device via switching devices SWA/SW1 and SWB/SW2, and the return USB differential data signal is grounded via SW3/SWE. If the apparatus 200 detects a device connected to the USB port 250 that is to receive the analog audio signal, the application processor (AP) closes switching devices SWC, SWD, SWE, and SW1-SW3, and opens SWA and SWB. In this configuration, the analog audio signal AUD (R) and AUD (L) is sent to the device via switching devices SWC/SW1 and SWD/SW2, and the return USB differential data signal is grounded via SW3/SWE.

The same issues that were discussed above with respect to the same switching devices SW1-SW3 of apparatus 100 still apply. That is, for the relatively high data rates of the USB differential data signal, the switching devices SW1-SW3 should be made relatively small to keep the capacitances low associated with these devices so they do not adversely impact the USB differential data signal. To handle the THD requirements of the analog audio signal, the switching devices SW1-SW3 should be made relatively large to handle the relatively high power/voltage of the analog audio signal.

Figure 3:
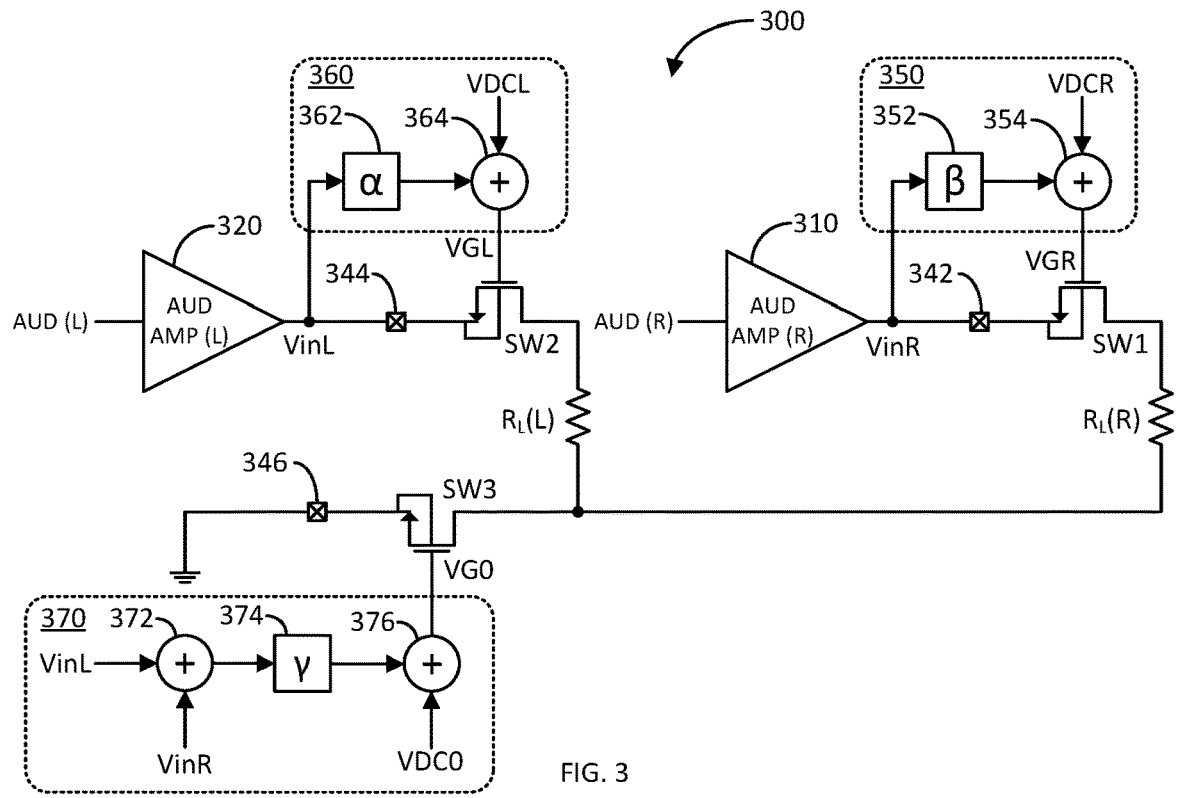
FIG. 3 illustrates a schematic diagram of an example apparatus for transmitting an analog audio signal to an audio transducer in accordance with another aspect of the disclosure.

FIG. 3 illustrates a schematic diagram of an example apparatus 300 for transmitting an analog audio signal to an audio transducer in accordance with another aspect of the disclosure. In summary, the set of switching devices SW1-SW3 are configured as field effect transistors (FETs), such as n-channel metal oxide semiconductor field effect transistors (NMOS FETs). Further, the apparatus 300 includes gate drive circuits configured to provide gate voltages to the switching FETs SW1-SW3 such that they are operated in a more linear manner to reduce the THD of the analog audio signal. This allows the use of relatively small switching FETs SW1-SW3 so as not to significantly impact the USB differential data signal, while linearizing the operations of the switching FETs SW1-SW3 so they can handle the analog audio signal.

More specifically, the apparatus 300 includes a first audio amplifier 310, a first gate drive circuit 350, and a first switching FET SW1. The apparatus 300 further includes a second audio amplifier 320, a second gate drive circuit 360, and a second switching FET SW2. Additionally, the apparatus 300 includes a third gate drive circuit 370 and a third switching FET SW3. A first audio load $R_L(R)$, such as a right-channel audio transducer (e.g., a headphone, earpiece or speaker), is coupled or connected between the first switching FET SW1 and the third switching FET SW3. A second audio load $R_L(L)$, such as a left-channel audio transducer (e.g., a headphone, earpiece or speaker), is coupled or connected between the second switching FET SW2 and the third switching FET SW3.

The first audio amplifier 310 includes an input configured to receive a right-channel analog audio signal AUD (R), and amplify the analog audio signal AUD (R) to generate an output voltage VinR. The first gate drive circuit 350 includes a first voltage scaling device 352 and a first voltage summer 354. The first voltage scaling device 352 includes an input coupled to the output of the first audio amplifier 310, and is configured to scale the output voltage VinR by a scaling factor β. The first voltage summer 354 includes a first input coupled to an output of the first voltage scaling device 352, a second input configured to receive a direct current (DC) voltage VDCR, and an output configured to produce a first gate voltage VGR for the gate of the first switching FET SW1. Thus, the first gate voltage VGR may be represented by the following equation:

$$VGR = VinR*\beta + VDCR \qquad \text{Eq. 1}$$

The first audio amplifier 310 and/or the first gate drive circuit 350 may be part of an integrated circuit (IC) or dedicated circuitry. The first switching FET SW1 includes a source (and bulk) coupled to the output of the first audio amplifier 310 via node or pad 342, a gate coupled to the output of the first gate drive circuit 350, and a drain coupled to a first terminal of the right-channel audio load $R_L(R)$.

The second audio amplifier 320 includes an input configured to receive a left-channel analog audio signal AUD (L), and amplify the analog audio signal AUD (L) to generate an output voltage VinL. The second gate drive circuit 350 includes a second voltage scaling device 362 and a second voltage summer 364. The second voltage scaling device 362 includes an input coupled to the output of the second audio amplifier 320, and is configured to scale the output voltage VinL by a scaling factor α. The second voltage summer 364 includes a first input coupled to an output of the second voltage scaling device 362, a second input configured to receive a DC voltage VDCL, and an output configured to produce a second gate voltage VGL for the gate of the second switching FET SW2. Thus, the second gate voltage VGL may be represented by the following equation:

$$VGL = VinL*\alpha + VDCL \qquad \text{Eq. 2}$$

The second audio amplifier 320 and/or the second gate drive circuit 360 may be part of an integrated circuit (IC) or dedicated circuitry. The second switching FET SW2 includes a source (and bulk) coupled to the output of the second audio amplifier 320 via node or pad 344, a gate coupled to the output of the second gate drive circuit 360, and a drain coupled to a first terminal of the left-channel audio load $R_L(L)$.

The third gate drive circuit 370 includes a third voltage summer 372, a third voltage scaling device 374 and a fourth voltage summer 376. The third voltage summer 372 includes first and second inputs coupled to the outputs of the first and second audio amplifiers 310 and 320, respectively. Accordingly, the third voltage summer 372 is configured to sum the output voltages VinR and VinL of the first and second audio amplifiers 310 and 320, respectively. The third voltage scaling device 374 includes an input coupled to the output of the third voltage summer 372, and is configured to scale the sum of the output voltage VinR+VinL by a scaling factor γ. The fourth voltage summer 376 includes a first input coupled to an output of the third voltage scaling device 374, a second input configured to receive a DC voltage VDC0, and an output configured to produce a third gate voltage VG0 for the gate of the third switching FET SW3. Thus, the third gate voltage VG0 may be represented by the following equation:

$$VG0 = (VinR + VinL)*\gamma + VDC0 \qquad \text{Eq. 3}$$

The third gate drive circuit 370 may be part of an integrated circuit (IC) or dedicated circuitry. The third switching FET SW1 includes a source (and bulk) coupled to ground via node or pad 346, a gate coupled to the output of the third gate drive circuit 370, and a drain coupled to respective second terminals of the right- and left-channel audio loads $R_L(R)$ and $R_L(L)$.

The linearization of the switching FETs SW1-SW3 operates as follows: If the switching FETs SW1-SW3 were to be operated by a constant gate voltage, the resistances of the FETs would vary with the audio voltages VinR, VinL, and VinR+VinL because their respective gate-to-source voltages vary with these voltages VinR, VinL, and VinR+VinL, respectively. The variation of the voltage in combination with the variation of the FET resistance produces a non-linear response that increases the THD of the analog audio signal. However, the gate drive circuits 350, 360, and 370 generate gate voltages VGR, VGL, and VG0 that varies proportionally with the input voltages VinR, VinL, and VinR+VinL in accordance with equations 1-3, respectively. Since the gate voltage and the source voltage varying in a similar manner, the gate-to-source voltages of the FETs SW1-SW3 remain substantially constant; and consequently, the FET resistance remain substantially constant. This results in a more linearized response of the switching FETs SW1-SW3; thereby, allowing the FETs to be made smaller for USB differential data purposes, and reducing the THD for analog audio signal purpose.

The DC voltages VDCR, VDCL, and VDC0 applied to the gates of the switching FETs SW1-SW3 as indicated in equations 1-3 are to keep the switching FETs SW1-SW3 minimally turned on or turned on to a certain degree, while the proportional components β*VinR, α*VinL, and γ*(VinR+VinL) drive the switching FETs SW1-SW3 harder in proportion to the voltages VinR, VinL, and (VinR+VinL) to produce a more linearized response from the switching FETs SW1-SW3, respectively.

Figure 4:
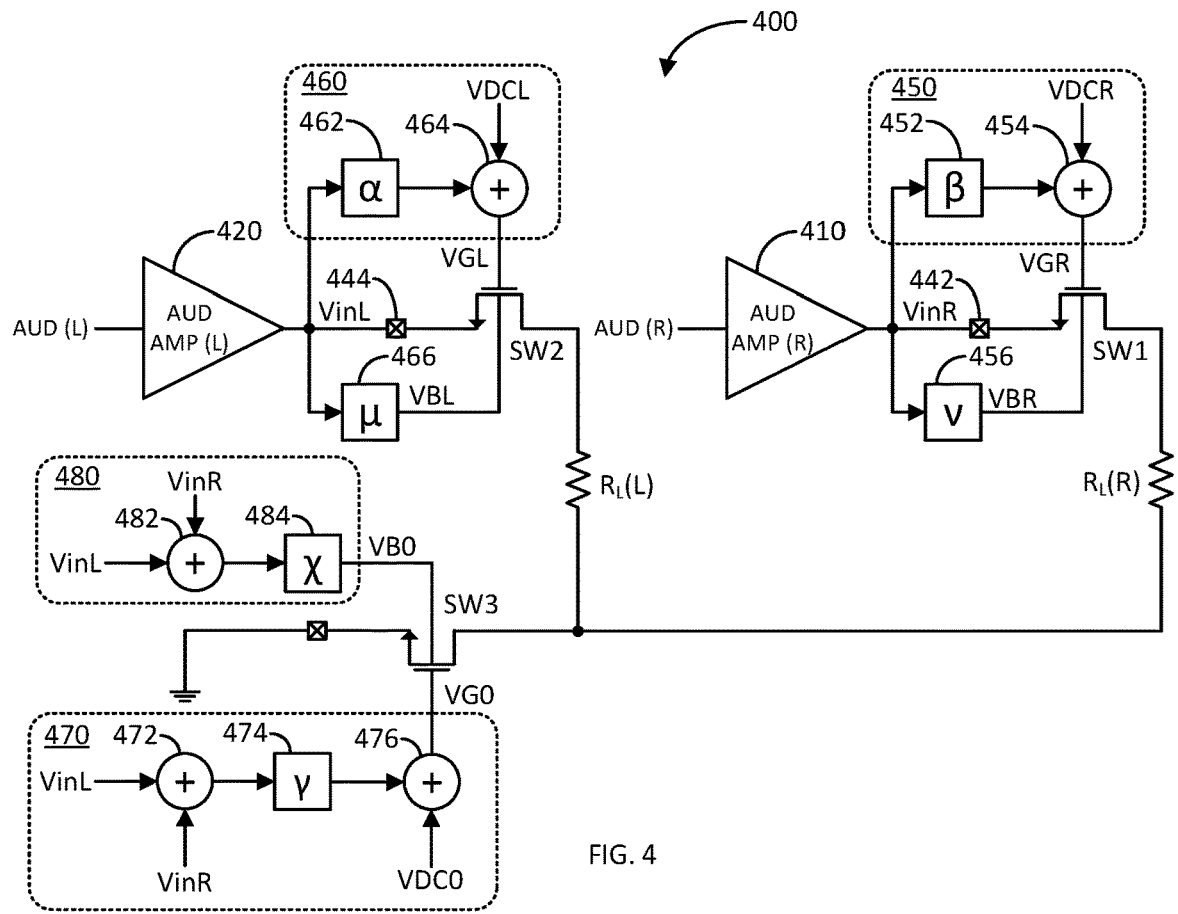
FIG. 4 illustrates a schematic diagram of another example apparatus for transmitting an analog audio signal to an audio transducer in accordance with another aspect of the disclosure.

FIG. 4 illustrates a schematic diagram of another example apparatus 400 for transmitting an analog audio signal to an audio transducer in accordance with another aspect of the disclosure. The apparatus 400 is similar to that of apparatus 300, and includes many of the same elements, such as first and second audio amplifiers 410 and 420, a set of switching FETs SW1-SW3, a set of gate drive circuits 450, 460, and 470 including voltage scaling devices 452, 462, and 474, summers 454, 464, and 476, and additional summer 474 in the case of gate drive circuit 470. The configuration and operation of these elements have been described with reference to the same elements in apparatus 300, which are identified with the same reference numbers with the exception that the most significant digit is a "4" in apparatus 400 instead of a "3" in apparatus 300.

The apparatus 400 further includes a set of bulk bias circuits 456, 466, and 480 configured to generate bulk voltages VBR, VBL, and VB0 for the set of switching FETs SW1-SW3, respectively. Accordingly, the set of bulk bias circuits 456, 466, and 480 include a set of outputs (at which the bulk voltages VBR, VBL, and VB0 are generated) coupled to the bulks of the set of switching FETs SW1-SW3, respectively. Note that the bulks of the switching FETs SW1-SW3 in apparatus 400 are not coupled to the corresponding sources of the FETs SW1-SW3, respectively.

The bulk bias circuit 456 is configured as a voltage scaling device configured to scale the voltage VinR at the output of the first audio amplifier 410 by a factor ν to generate the bulk voltage VBR for the switching FET SW1. The bulk bias circuit 466 is configured as a voltage scaling device configured to scale the voltage VinL at the output of the second audio amplifier 420 by a factor μ to generate the bulk voltage VBL for the switching FET SW2. The bulk bias circuit 480 includes a voltage summer 482 including inputs coupled to the outputs of the first and second audio amplifiers 410 and 420, respectively. Accordingly, the voltage summer 482 is configured to sum the voltages VinR and VinL at the outputs of the first and second audio amplifiers 410 and 420, respectively. The bulk bias circuit 480 further includes a voltage scaling device 484 configured to scale the sum of the voltages VinR and VinL by a factor χ to generate the bulk voltage VB0 for the switching FET SW3.

The bulk bias circuits 456, 466, and 480 are particularly useful when the output voltages VinR, VinL, and VinR+VinL swing between positive and negative voltages. The scaling factors ν, μ, and χ may be configured to set the bulk voltages VBR, VBL, and VB0 substantially around the middle of the voltage swing of the voltages VinR, VinL, and VinR+VinL, respectively. In such case, the drain-to-bulk voltage and the source-to-bulk voltage swing between similar voltage ranges. Thus, the switching FETs SW1-SW3 are operated more symmetrical.

Figure 5:
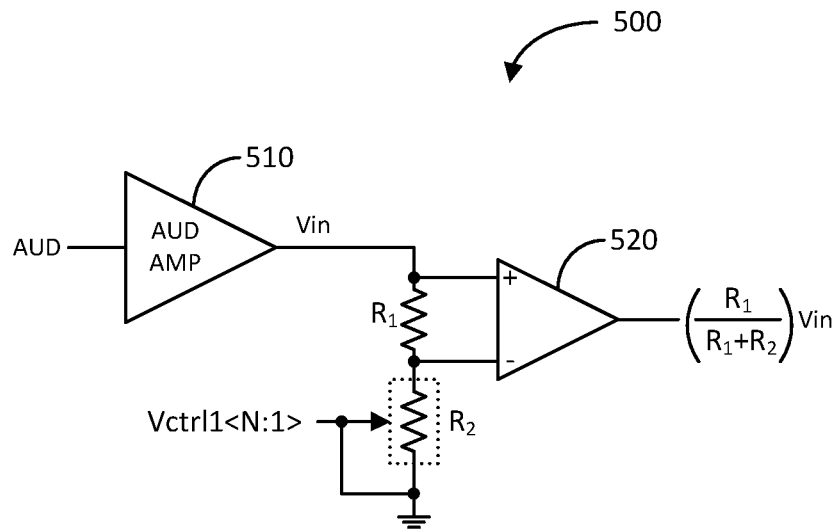
FIG. 5 illustrates a schematic diagram of an example voltage scaling circuit in accordance with another aspect of the disclosure.

FIG. 5 illustrates a schematic diagram of an example voltage scaling circuit 500 in accordance with another aspect of the disclosure. The voltage scaling circuit 500 may be an example of any of the voltage scaling circuits 352, 362, 452, 456, 462, and 466 previously discussed. The voltage scaling circuit 500 is also shown with a corresponding audio amplifier 510, which may correspond to any of the audio amplifiers 310, 320, 410, and 420 previously discussed.

The voltage scaling circuit 500 includes a difference amplifier 520, a first resistor $R_1$, and a second resistor $R_2$, which may be variable. The first and second resistors $R_1$ and $R_2$ are coupled or connected in series between the output of the audio amplifier 510 and a voltage rail (e.g., ground). The difference amplifier 520 includes a first input (e.g., a positive input) coupled to the output of the audio amplifier 510, and a second input (e.g., a negative input) coupled to a node between the first and second resistors $R_1$ and $R_2$. A control signal Vctrl1<N:1> controls the net resistance of the variable resistor $R_2$ between the negative input of the difference amplifier 520 and the voltage rail. If $R_T$ is the total resistance of the variable resistor $R_2$, and $R_2$ is also the net resistance of the variable resistor $R_2$, then the net resistance $R_2$ may be determined by the following equation:

$$R_2 = R_T * (2^{<N:1>}/2^N)$$ Eq. 4

Where <N:1> is the digital value of the control signal Vctrl1<N:1>. Assuming the difference amplifier 520 has a unity gain, the difference amplifier 520 includes an output configured to produce a scaled voltage Vs in accordance with the following equation:

$$V_S = \left(\frac{R_1}{R_1 + R_2}\right) Vin$$ Eq. 5

Where $R_1$ is the resistance of the resistor $R_1$. Thus, by selecting/adjusting the resistances $R_1$ and $R_2$ corresponding to the voltage scaling circuits 352/452, 362/462, 456, and 466, the scaling factors β, α, ν, and μ may be set.

Figure 6:
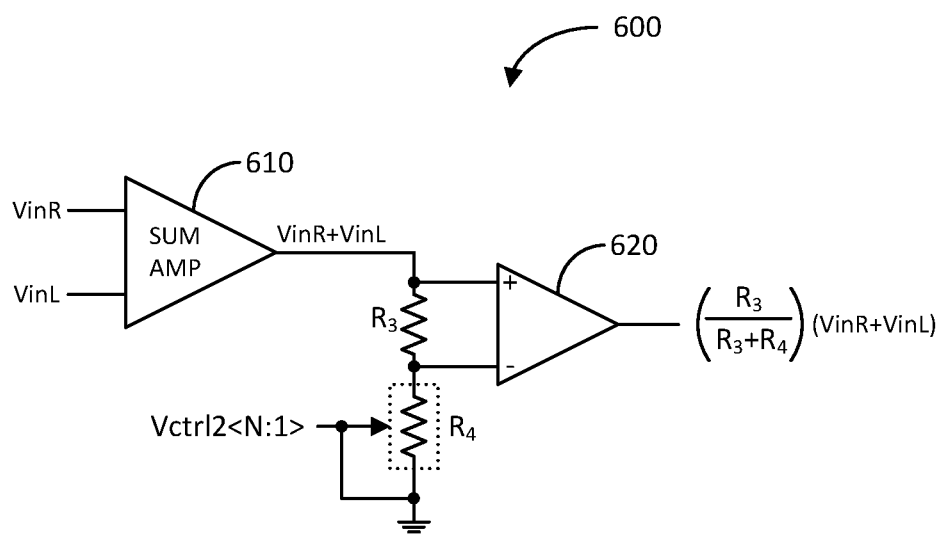
FIG. 6 illustrates a schematic diagram of an example voltage summer and scaling circuit in accordance with another aspect of the disclosure.

FIG. 6 illustrates a schematic diagram of an example voltage summer and scaling circuit 600 in accordance with another aspect of the disclosure. The voltage summer and scaling circuit 600 may be an example of a series-connected voltage summer and voltage scaling circuit, such summers-voltage scaling circuits 372-374, 472-474, and 482-484 previously discussed.

The voltage summer and scaling circuit 600 includes a summing amplifier 610 including inputs configured to receive the output voltages VinR and VinL from the outputs of the first and second audio amplifiers 310/410 and 320/420, respectively. Assuming the summing amplifier 610 has unity gain, the summing amplifier 610 is configured to generate the sum of the voltages VinR+VinL. The voltage summer and scaling circuit 600 further includes a difference amplifier 620, a first resistor $R_3$, and a second resistor $R_4$, which may be variable. The first and second resistors $R_3$ and $R_4$ are coupled or connected in series between the output of the summing amplifier 610 and a voltage rail (e.g., ground). The difference amplifier 620 includes a first input (e.g., a positive input) coupled to the output of the summing amplifier 610, and a second input (e.g., a negative input) coupled to a node between the first and second resistors $R_3$ and $R_4$. A control signal Vctrl2<N:1> controls the net resistance of the variable resistor $R_4$ between the negative input of the difference amplifier 620 and the voltage rail. If $R_T$ is the total resistance of the variable resistor $R_4$, and $R_4$ is also the net resistance of the variable resistor $R_4$, then the net resistance $R_4$ may be determined by the following equation:

$$R_4 = R_T * (2^{<N:1>}/2^N)$$ Eq. 6

Where <N:1> is the digital value of the control signal Vctrl2<N:1>. Assuming the difference amplifier 620 has a unity gain, the difference amplifier 620 includes an output configured to produce a scaled voltage Vs in accordance with the following equation:

$$V_S = \left(\frac{R_3}{R_3 + R_4}\right)(VinR + VinL)$$ Eq. 7

Where $R_3$ is the resistance of the resistor $R_3$. Thus, by selecting/adjusting the resistances $R_3$ and $R_4$ corresponding to the voltage scaling circuits 374/474 and 484, the scaling factors γ and χ may be set.

Figure 7:
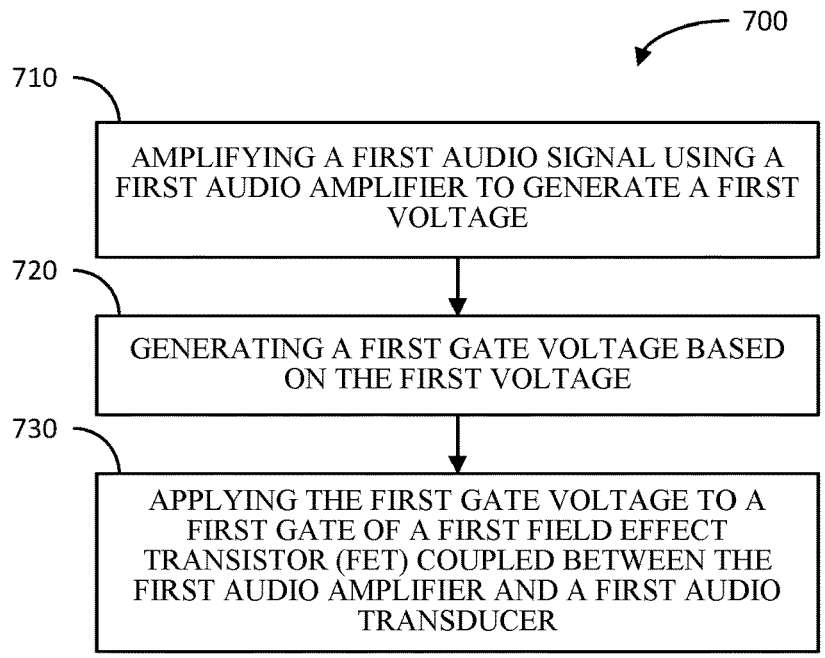
FIG. 7 illustrates a flow diagram of an example method of transmitting an audio signal to an audio transducer in accordance with another aspect of the disclosure.

FIG. 7 illustrates a flow diagram of an example method 700 for transmitting an audio signal to an audio transducer in accordance with another aspect of the disclosure. The method 700 includes amplifying a first audio signal using a first audio amplifier to generate a first voltage (block 710). Examples of means for amplifying a first audio signal using a first audio amplifier to generate a first voltage any of the audio amplifiers 310, 320, 410, and 420 previously discussed.

The method 700 further includes generating a first gate voltage based on the first voltage (block 720). Examples of means for generating a first gate voltage based on the first voltage include any of the gate drive circuits 350, 360, 450, 460, and 500 previously discussed.

The method 700 additionally includes applying the first gate voltage to a first gate of a first field effect transistor (FET) coupled between the first audio amplifier and a first audio transducer (block 730). Examples of means for applying the first gate voltage to a first gate of a first field effect transistor (FET) coupled between the first audio amplifier and a first audio transducer include the coupling of the gate drive circuits 350, 360, 450, 460, and 500 to the gate of the corresponding FETs SW1 and SW2.

The method 700 also includes applying the first voltage to a first source of the first FET. Examples of means for applying the first voltage to a first source of the first FET include the coupling of the outputs of the amplifiers 310, 320, 410, and 420 to the sources of FETs SW1 and SW2.

The generating of the first gate voltage as specified in block 720 may include scaling the first voltage by a first scaling factor to generate a first scaled voltage, and summing the first scaled voltage with a first direct current (DC) voltage to generate the first gate voltage. Examples of means for scaling the first voltage by a first scaling factor to generate a first scaled voltage include any of the voltage scaling circuits 352, 362, 374, 452, 464, and 474. Examples of means for summing the first scaled voltage with a first direct current (DC) voltage to generate the first gate voltage include any of the voltage summers 354, 364, 376, 454, 464, and 476.

The method 700 may further include amplifying a second audio signal using a second audio amplifier to generate a second voltage; generating a second gate voltage based on the second voltage; applying the second gate voltage to a second gate of a second field effect transistor (FET) coupled between the second audio amplifier and a second audio transducer; and applying the second voltage to a second source of the second FET. The means for performing these operations have been previously discussed with reference to blocks 710, 720, 730, and 740.

The method 700 may further include generating a third gate voltage based on a sum of the first and second voltages, and applying the third gate voltage to a third gate of a third field effect transistor (FET) coupled between the first and second audio transducers and a voltage rail. Examples of means for generating a third gate voltage based on a sum of the first and second voltages include any of the first voltage summers 372 and 472, voltage scaling devices 374 and 474, and second voltage summers 376 and 476. Examples of means for applying the third gate voltage to a third gate of a third field effect transistor (FET) coupled between the first and second audio transducers and a voltage rail include the coupling of the outputs of the gate drive circuits 370 and 470 to the gates of the switching FET SW3.

Additionally, the method 700 may include generating a first bulk voltage based on the first voltage, applying the first bulk voltage to a first bulk of the first FET, generating a second bulk voltage based on the second voltage, applying the second bulk voltage to a second bulk of the second FET, generating a third bulk voltage based on a sum of the first and second voltages, and applying the third bulk voltage to a third bulk of the third FET.

Example of means for generating a first bulk voltage based on the first voltage includes bulk bias circuit 456. Example of means for applying the first bulk voltage to a first bulk of the first FET includes the coupling of the output of the bulk bias circuit 456 to the bulk of switching FET SW1. Example of means for generating a second bulk voltage based on the second voltage includes bulk bias circuit 466. Example of means for applying the second bulk voltage to a second bulk of the second FET includes the coupling of the output of the bulk bias circuit 466 to the bulk of switching FET SW2. Example of means for generating a third bulk voltage based on a sum of the first and second voltages includes bulk bias circuit 480. Example of means for applying the third bulk voltage to a third bulk of the third FET includes the coupling of the bulk bias circuit 480 to the bulk of the switching FET SW3.

Figure 8:
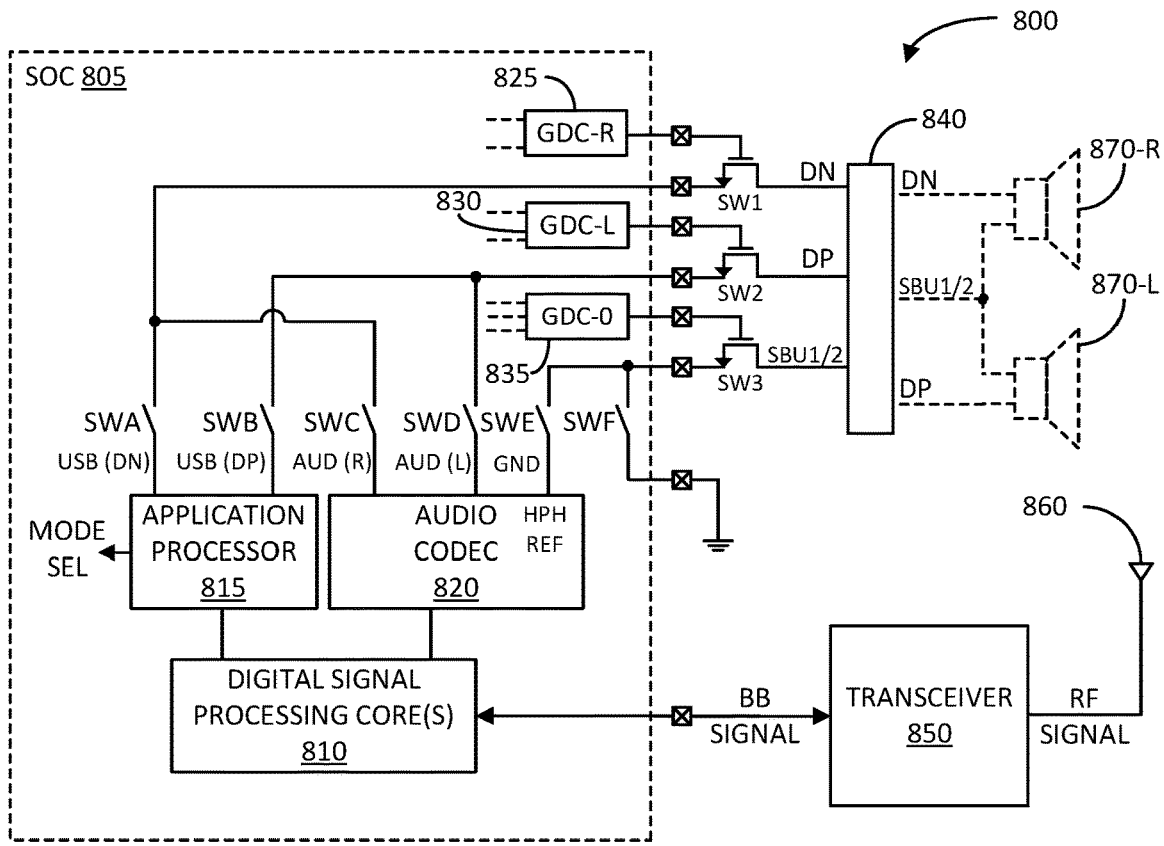
FIG. 8 illustrates a block diagram of an example wireless communication device in accordance with another aspect of the disclosure.

FIG. 8 illustrates a block diagram of an example wireless communication device 800 in accordance with another aspect of the disclosure. The wireless communication device 800 includes at least one antenna 860 (e.g., at least one antenna array), a transceiver 850, and an integrated circuit (IC) 805, which may be configured as a system on chip (SOC). The SOC 805 includes one or more digital signal processing cores 810, an application processor 815, an audio codec 820, switching devices SWA-SWF, and gate drive circuits GDC-R 825, GDC-L 830, and GDC-0 835.

The one or more digital signal processing cores 810 may be configured to process data to generate a baseband (BB) signal, the transceiver 850 may be configured to process the baseband (BB) signal received from the one or more digital signal processing cores 810 to generate a radio frequency (RF) signal. The at least one antenna 860 may be configured to radiate the RF signal for wireless transmission to one or more remote devices. Similarly, the at least one antenna 860 is configured to receive an RF signal from a remote device, the transceiver 850 may be configured to process the RF signal received from the at least one antenna 860 to generate a baseband (BB) signal. The one or more digital signal processing cores 810 may be configured to process the baseband (BB) signal to extract data therefrom.

In USB mode, the application processor 815 may receive data from the one or more digital signal processing cores 810, and generate a USB differential data signal USB (DN) and USB (DP). The application processor 815 may provide the USB differential data signal USB (DN) and USB (DP) to the sources of switching FETs SW1-SW2 via closed switching devices SWA-SWB controlled by a mode select signal generated by the application processor 815, respectively. Also, in USB mode, the application processor 815 may receive the USB differential data signal USB (DN) and USB (DP) via the turned-on switching FETs SW1-SW2 and closed switching devices SWA-SWB, respectively, and provide data based on the received USB differential data signal to the one or more digital signal processing cores 810.

In audio mode, the audio codec 820 may receive data from the one or more digital signal processing cores 810, and generate an analog audio signal AUD (R) and AUD (L). The audio codec may provide the analog audio signal AUD (R) and AUD (L) to the sources of switching FETs SW1-SW2 via closed SWC-SWD controlled by the mode select signal, respectively. The gate drive circuits (GDC-R) 825 and GDC-L 830 are configured to generate gate voltages for the switching FETs SW1-SW2 proportional to the voltages VinR and VinL at the outputs AUD (R) and AUD (L) in audio mode, respectively.

The switching FET SW3 provides a ground or return for audio transducers 870-R and 870-L connected to a USB port 840. The apparatus 800 includes a gate drive circuit (GDC-0) 835 configured to generate a gate voltage for the switching FET SW3 proportional to a sum of the voltages VinR+VinL at the outputs AUD (R) and AUD (L) in audio mode. Ground potential may be applied to the source of switching device SW3 and a headphone reference (HPF REF) input of the audio codec 820 via closed switching device SWF and/or SWE. The drains of the switching devices FETs SW1-SW3 are coupled to the DN, DP, and SBU1/2 terminals of the USB port 840; and when the audio transducers 870-R and 870-L is connected to the USB ports, the positive terminals and the common return of the audio transducers 870-R and 870-L are coupled to the DN, DP, and SBU1/2 terminals of the USB port 840, respectively. Alternatively, a USB digital data device (e.g., USB memory device, keyboard, mouse, etc.) may be connected to the USB port 840 instead of the audio transducers. In USB mode, the switching device SWF may be closed.

Figure 9A:
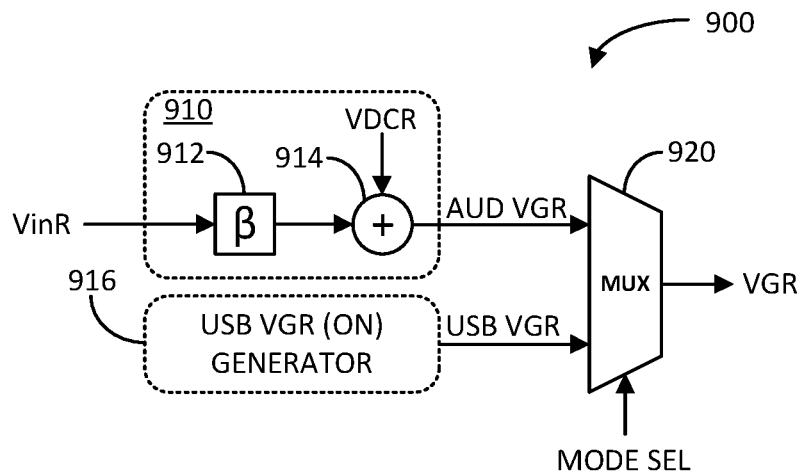
FIGS. 9A-9C illustrate schematic diagrams of exemplary gate drive circuits in accordance with other aspects of the disclosure.

FIG. 9A illustrates a schematic diagram of an exemplary gate drive circuit 900 in accordance with another aspect of the disclosure. The gate drive circuit 900 may be an example of a more detailed implementation of gate drive circuit GDC-R 825 previously discussed. The gate drive circuit 900 includes an audio-mode gate drive subcircuit 910 including a voltage scaling (P) device 912 including an input coupled to an output of the AUD(R) output of the audio codec 820, and configured to receive an input voltage VinR; and a summer 914 including a first input coupled to an output of the voltage scaling device 912, a second input configured to receive a DC voltage VDCR, and an output configured to generate an audio-mode gate voltage AUD VGR for the first switching FET SW1.

The gate drive circuit 900 may further include a USB-mode gate voltage VGR generator 916 configured to generate a USB-mode gate voltage USB VGR to maintain the first switching FET SW1 turned on in USB mode. The gate drive circuit 900 further includes a multiplexer 920 including a first input coupled to the output of the audio-mode gate drive subcircuit 910, a second input coupled to the output of the USB gate voltage generator 916, a select input configured to receive the mode select signal from the application processor 815, and an output configured to produce a gate voltage VGR for the first switching FET SW1. Thus, if the mode select signal indicates audio mode, the multiplexer 920 outputs the audio-mode gate voltage AUD VGR as the gate voltage VGR for the first switching FET SW1. If the mode select signal indicates USB mode, the multiplexer 920 outputs the USB-mode gate voltage USB VGR as the gate voltage VGR for the first switching FET SW1.

Figure 9B:
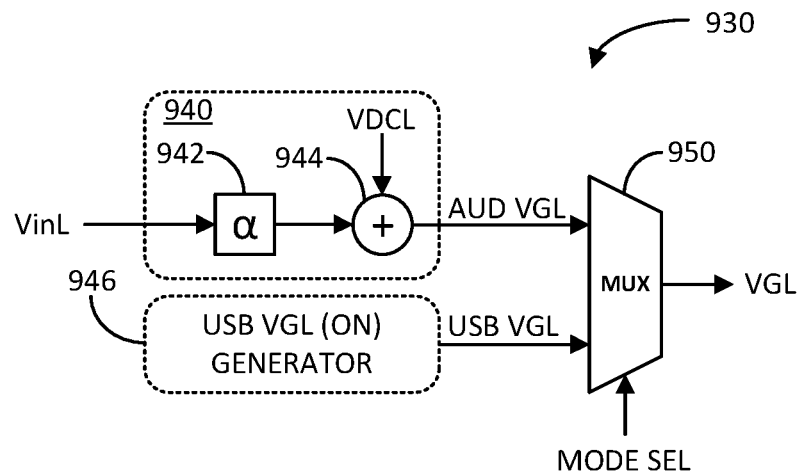

FIG. 9B illustrates a schematic diagram of another exemplary gate drive circuit 930 in accordance with another aspect of the disclosure. The gate drive circuit 930 may be an example of a more detailed implementation of gate drive circuit GDC-L 830 previously discussed. The gate drive circuit 930 includes an audio-mode gate drive subcircuit 940 including a voltage scaling (a) device 912 including an input coupled to an output of the AUD(L) output of the audio codec 820, and configured to receive an input voltage VinL; and a summer 944 including a first input coupled to an output of the voltage scaling device 942, a second input configured to receive a DC voltage VDCL, and an output configured to generate an audio-mode gate voltage AUD VGL for the second switching FET SW2.

The gate drive circuit 930 may further include a USB-mode gate voltage VGL generator 946 configured to generate a USB-mode gate voltage USB VGL to maintain the second switching FET SW2 turned on in USB mode. The gate drive circuit 930 further includes a multiplexer 950 including a first input coupled to the output of the audio-mode gate drive subcircuit 940, a second input coupled to the output of the USB gate voltage generator 946, a select input configured to receive the mode select signal from the application processor 815, and an output configured to produce a gate voltage VGL for the second switching FET SW2. Thus, if the mode select signal indicates audio mode, the multiplexer 950 outputs the audio-mode gate voltage AUD VGL as the gate voltage VGL for the second switching FET SW2. If the mode select signal indicates USB mode, the multiplexer 950 outputs the USB-mode gate voltage USB VGL as the gate voltage VGL for the second switching FET SW2.

Figure 9C:
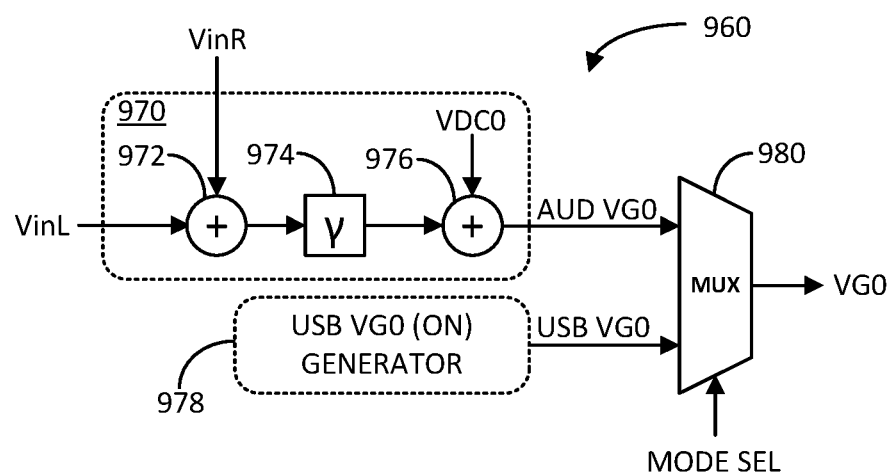

FIG. 9C illustrates a schematic diagram of another exemplary gate drive circuit 960 in accordance with another aspect of the disclosure. The gate drive circuit 960 may be an example of a more detailed implementation of gate drive circuit GDC-0 835 previously discussed. The gate drive circuit 960 includes an audio-mode gate drive subcircuit 970 including a first summer 972 including inputs coupled to the AUD(R) and AUD(L) outputs of the audio codec 820; a voltage scaling (γ) device 974 including an input coupled to an output of the first summer 972; and a second summer 976 including a first input coupled to an output of the voltage scaling device 974, a second input configured to receive a DC voltage VDC0, and an output configured to generate an audio-mode gate voltage AUD VG0 for the third switching FET SW3.

The gate drive circuit 960 may further include a USB-mode gate voltage VG0 generator 978 configured to generate a USB-mode gate voltage USB VG0 to maintain the third switching FET SW3 turned on in USB mode. The gate drive circuit 960 further includes a multiplexer 980 including a first input coupled to the output of the audio-mode gate drive subcircuit 970, a second input coupled to the output of the USB gate voltage generator 978, a select input configured to receive the mode select signal from the application processor 815, and an output configured to produce a gate voltage VG0 for the third switching FET SW3. Thus, if the mode select signal indicates audio mode, the multiplexer 980 outputs the audio-mode gate voltage AUD VG0 as the gate voltage VG0 for the third switching FET SW3. If the mode select signal indicates USB mode, the multiplexer 980 outputs the USB-mode gate voltage USB VG0 as the gate voltage VG0 for the third switching FET SW3.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   a first amplifier;
   a first field effect transistor (FET) including a first source coupled to an output of the first amplifier, and a first drain for coupling to a first load; and
   a first gate drive circuit including an input coupled to the output of the first amplifier and an output coupled to a first gate of the first FET.

2. The apparatus of claim 1, wherein the first gate drive circuit comprises a voltage scaling device including an input coupled to the output of the first amplifier.

3. The apparatus of claim 1, wherein the first gate drive circuit comprises:
   a voltage scaling device including an input coupled to the output of the first amplifier; and
   a voltage summer including a first input coupled to an output of the voltage scaling device, a second input configured to receive a direct current (DC) voltage, and an output coupled to the first gate of the first FET.

4. The apparatus of claim 3, wherein the voltage scaling device comprises:
   first and second resistors coupled in series between the output of the first amplifier and a voltage rail; and
   a difference amplifier including a first input coupled to the output of the first amplifier, a second input coupled to a node between the first and second resistors, and an output coupled to the first gate of the first FET.

5. The apparatus of claim 1, wherein the first amplifier comprises an input configured to receive an analog audio signal.

6. The apparatus of claim 1, wherein the first load comprises an audio transducer.

7. The apparatus of claim 1, further comprising a Universal Serial Bus (USB) port coupled between the first FET and the first load.

8. The apparatus of claim 1, further comprising:
   a second amplifier;
   a second field effect transistor (FET) including a second source coupled to an output of the second amplifier, and a second drain for coupling to a second load; and
   a second gate drive circuit including an input coupled to the output of the second amplifier and an output coupled to a second gate of the second FET.

9. The apparatus of claim 8, wherein the second gate drive circuit comprises a voltage scaling device including an input coupled to the output of the second amplifier.

10. The apparatus of claim 8, wherein the second gate drive circuit comprises:
    a voltage scaling device including an input coupled to the output of the second amplifier; and
    a voltage summer including a first input coupled to an output of the voltage scaling device, a second input configured to receive a direct current (DC) voltage, and an output coupled to the second gate of the second FET.

11. The apparatus of claim 8, further comprising:
    a third field effect transistor (FET) including a third source coupled to a voltage rail, and a third drain for coupling to the first and second loads; and
    a third gate drive circuit including a first input coupled to the output of the first amplifier, a second input coupled to the output of the second amplifier, and an output coupled to a third gate of the third FET.

12. The apparatus of claim 11, wherein the third gate drive circuit comprises:
    a first voltage summer including a first input coupled to the output of the first amplifier, and a second input coupled to the output of the second amplifier;
    a voltage scaling device including an input coupled to the output of the first voltage summer; and
    a second voltage summer including a first input coupled to an output of the voltage scaling device, a second input configured to receive a direct current (DC) voltage, and an output coupled to the third gate of the third FET.

13. The apparatus of claim 12, wherein the first voltage summer comprises a summing amplifier including a first input coupled to the output of the first amplifier, and a second input coupled to the output of the second amplifier, and wherein the voltage scaling device comprises:
    first and second resistors coupled in series between an output of the summing amplifier and a voltage rail; and
    a difference amplifier including a first input coupled to the output of the summing amplifier, a second input coupled to a node between the first and second resistors, and an output coupled to the third gate of the third FET.

14. The apparatus of claim 1, further comprising a first bulk drive circuit including an input coupled to the output of the first amplifier, and an output coupled to a first bulk of the first FET.

15. The apparatus of claim 14, wherein the first bulk drive circuit comprises a voltage scaling device.

16. The apparatus of claim 14, further comprising:
    a second amplifier;
    a second field effect transistor (FET) including a second source coupled to an output of the second amplifier, and a second drain for coupling to a second load; and
    a second gate drive circuit including an input coupled to the output of the second amplifier and an output coupled to a second gate of the second FET.

17. The apparatus of claim 16, further comprising a second bulk drive circuit including an input coupled to the output of the second amplifier, and an output coupled to a second bulk of the second FET.

18. The apparatus of claim 17, wherein the second bulk drive circuit comprises a voltage scaling device.

19. The apparatus of claim 17, further comprising:
    a third field effect transistor (FET) including a third source coupled to a voltage rail, and a third drain for coupling to the first and second loads; and
    a third gate drive circuit including a first input coupled to the output of the first amplifier, a second input coupled to the output of the second amplifier, and an output coupled to a third gate of the third FET.

20. The apparatus of claim 19, further comprising a third bulk drive circuit including a first input coupled to the output of the first amplifier, a second input coupled to the output of the second amplifier, and an output coupled to a third bulk of the third FET.

21. The apparatus of claim 20, wherein the third bulk drive circuit comprises:
    a voltage summer including a first input coupled to the output of the first amplifier, and a second input coupled to the output of the second amplifier; and
    a voltage scaling device including an input coupled to an output of the voltage summer, and an output coupled to the third bulk of the third FET.

22. A method, comprising:
    amplifying a first audio signal using a first audio amplifier to generate a first voltage;
    generating a first gate voltage based on the first voltage, wherein generating the first gate voltage comprises:
      scaling the first voltage by a first scaling factor to generate a first scaled voltage; and
      summing the first scaled voltage with a first direct current (DC) voltage to generate the first gate voltage; and
    applying the first gate voltage to a first gate of a first field effect transistor (FET) coupled between the first audio amplifier and a first audio transducer.

23. The method of claim 22, further comprising:
    amplifying a second audio signal using a second audio amplifier to generate a second voltage;
    generating a second gate voltage based on the second voltage; and
    applying the second gate voltage to a second gate of a second field effect transistor (FET) coupled between the second audio amplifier and a second audio transducer.

24. The method of claim 23, further comprising:

generating a third gate voltage based on a sum of the first and second voltages; and applying the third gate voltage to a third gate of a third field effect transistor (FET) coupled between the first and second audio transducers and a voltage rail.

25. The method of claim 24, further comprising:

generating a first bulk voltage based on the first voltage;

applying the first bulk voltage to a first bulk of the first FET;

generating a second bulk voltage based on the second voltage;

applying the second bulk voltage to a second bulk of the second FET;

generating a third bulk voltage based on a sum of the first and second voltages; and applying the third bulk voltage to a third bulk of the third FET.

26. An apparatus, comprising:

means for amplifying a first audio signal using a first audio amplifier to generate a first voltage;

means for generating a first gate voltage based on the first voltage; and means for applying the first gate voltage to a first gate of a first field effect transistor (FET) coupled between the first audio amplifier and a first audio transducer.

27. The apparatus of claim 26, further comprising:

means for amplifying a second audio signal using a second audio amplifier to generate a second voltage;

means for generating a second gate voltage based on the second voltage;

means for applying the second gate voltage to a second gate of a second field effect transistor (FET) coupled between the second audio amplifier and a second audio transducer.

28. The apparatus of claim 27, further comprising:

means for generating a third gate voltage based on a sum of the first and second voltages; and means for applying the third gate voltage to a third gate of a third field effect transistor (FET) coupled between the first and second audio transducers and a voltage rail.

29. A wireless communication device, comprising:

at least one antenna;

a transceiver coupled to the at least one antenna;

at least one digital signal processing core coupled to the transceiver;

a port configured to connect to one of at least one audio transducer and a digital data device;

at least one audio amplifier;

at least one field effect transistor (FET) including a source coupled to an output of the at least one audio amplifier, respectively, and a drain coupled to the port; and at least one gate drive circuit including an input coupled to the output of the at least one audio amplifier, and an output coupled to a gate of the at least one FET.

\* \* \* \* \*